United States Patent [19]
Gillette

[11] Patent Number: 6,005,408
[45] Date of Patent: Dec. 21, 1999

[54] SYSTEM FOR COMPENSATING FOR TEMPERATURE INDUCED DELAY VARIATION IN AN INTEGRATED CIRCUIT

[75] Inventor: Garry C. Gillette, San Jose, Calif.

[73] Assignee: Credence Systems Corporation, Fremont, Calif.

[21] Appl. No.: 08/904,081

[22] Filed: Jul. 31, 1997

[51] Int. Cl.$^6$ ................................................. G01R 31/02
[52] U.S. Cl. ...................... 324/765; 324/158.1; 324/760
[58] Field of Search .................................. 327/262, 512, 327/513; 324/765, 158.1, 760

[56] References Cited

U.S. PATENT DOCUMENTS

| | | | |
|---|---|---|---|
| 4,346,343 | 8/1982 | Berndlmaier et al. ................... | 323/282 |
| 4,594,565 | 6/1986 | Barreras .............................. | 331/108 A |
| 4,789,976 | 12/1988 | Fujishima ................................ | 369/54 |
| 4,879,505 | 11/1989 | Barrow et al. .......................... | 323/312 |
| 5,130,582 | 7/1992 | Ishihara et al. ........................ | 307/591 |
| 5,225,716 | 7/1993 | Endo et al. ........................... | 307/296.8 |
| 5,237,224 | 8/1993 | DeLisle et al. ......................... | 307/603 |
| 5,359,303 | 10/1994 | Mirow ..................................... | 331/176 |
| 5,376,846 | 12/1994 | Houston ................................. | 327/513 |
| 5,422,832 | 6/1995 | Moyal .................................... | 702/132 |
| 5,463,331 | 10/1995 | Kuo ......................................... | 326/86 |
| 5,731,735 | 3/1998 | Yokota et al. .......................... | 327/535 |

*Primary Examiner*—Josie Ballato
*Assistant Examiner*—Russell M. Kobert
*Attorney, Agent, or Firm*—Smith-Hill and Bedell

[57] ABSTRACT

A delay compensation circuit responds to a sensed change in operating temperature of a CMOS integrated circuit (IC) by appropriately adjusting the IC's power supply voltage so as to prevent the temperature change from affecting IC signal path delays. The delay compensation circuit senses the temperature change by monitoring a temperature sensitive voltage across a diode included in the IC and generates the power supply voltage as an appropriately adjusted linear function of the diode voltage.

12 Claims, 1 Drawing Sheet

SYSTEM FOR COMPENSATING FOR TEMPERATURE INDUCED DELAY VARIATION IN AN INTEGRATED CIRCUIT

BACKGROUND OF THE INVENTION

1. Field of the Invention

The present invention relates in general to integrated circuits and particular to a system for compensating for temperature induced delay variation in an integrated circuit.

2. Description of Related Art

A typical integrated circuit (IC) tester includes a set of pin electronics circuits, one for carrying out test activities at each terminal of a device under test (DUT). The test activities include sending test signals to the terminals and sampling DUT output signals produced at the terminals. Each pin electronics circuit carries out its test activities in response to timing signals produced by a timing signal generator. Each timing signal controls a separate test action, the pin electronics circuit carrying out the action in response to the timing signal's edges. An IC test is organized into a succession of test cycles during which test activities are carried out at the DUT terminals. The timing signal generator produces each timing signal edge in response to a pulse of a reference clock signal with a programmable delay indicated by an input pattern vector (data value) produced by a pattern generator at the start of each test cycle.

For example, in order for the tester to send a test signal edge to the DUT terminal 1 nanosecond after some particular reference clock signal pulse, the pattern vector must indicate the correct clock signal pulse and must indicate the desired 1 nanosecond delay. However the timing circuit does not wait the entire 1 nanosecond to initiate the timing signal pulse. Since transistor drivers in the signal path of the timing circuit between its clock signal input and its timing signal output must switch on or off when responding to the clock signal, the timing circuit has a fixed inherent signal path delay in addition to its programmable delay. Also transistor logic stages in the signal path of the pin electronics circuit between its input timing signal and its output test signal also have an inherent switching delay. Thus in order for the test signal edge to occur five nanoseconds after the selected reference clock signal edge, the programmable delay of the timing signal generator must calibrated to a value that is slightly less than five nanoseconds to account for the inherent delay of the timing generator as well as the inherent delay of the pin electronics circuit.

Once the timing signal generator is properly calibrated, the inherent signal path delays of timing signal generator and the pin electronics circuit should remain constant during the test. However these inherent signal path delays can change substantially with the temperature of the integrated circuits implementing the timing signal generator and the pin electronics circuit, particularly when they are CMOS integrated circuits.

Some prior art systems avoid temperature induced delay variations in an IC by using feedback control to keep the IC at a constant temperature. In such systems, a controller senses the temperature of an IC and supplies power to a heater which may be attached to the IC or formed by transistors within the IC itself. When the sensed temperature increases above a desired set point, the controller reduces or turns off the heater power. When the sensed temperature decreases below the set point, the controller increases or turns on the heater power. Some of these systems sense IC temperature by sensing the voltage across a temperature sensitive resistor formed on the IC. Other systems sense temperature by sensing the temperature dependent frequency of oscillation of a ring oscillator formed on the IC or by sensing the temperature dependent signal transit time of a signal traveling through a reference delay circuit formed on the IC. These temperature controlling systems are expensive because IC heaters are expensive. Also, since they cause an IC to operate at a relatively high constant temperature, they can reduce the operating life of the IC.

Other feedback control systems do not try to directly control IC temperature but instead monitor switching speed of the transistors forming the signal path within the IC and control that switching speed by controlling the power supply to those transistors. A transistor's switching speed varies with its power supply voltage. For example, some of these systems sense the frequency of a ring oscillator formed on the IC and adjust the IC power supply to maintain the ring oscillator frequency at a desired level. If the transistors forming the ring oscillator are similar to the transistors forming the signal path and share the same power supply, then by holding the ring oscillator frequency constant despite changes in IC temperature, the signal path delay is also held constant. While such systems do not require that the IC operate at high temperatures, they employ relatively complicated ring oscillators and/or reference delay circuits on the IC which increase the cost and difficulty of IC design and fabrication. Such systems also require the use of relatively complicated phase lock loop controllers which further add to system cost.

Thus although the prior art delay compensation systems work reasonably well, they are expensive to implement. What is needed is an inexpensive and easy to implement system for compensating for temperature induced delay variation in an IC.

SUMMARY OF THE INVENTION

A typical integrated circuit (IC) includes a set of transistors forming a signal path having a delay that is a linear function of the temperature of the IC. The path delay is also a linear function of an IC power supply voltage $V_{ss}$ providing power to those transistors over its normal operating range. In accordance with one aspect of the present invention, a delay compensation circuit senses IC temperature and appropriately increases or decreases $V_{ss}$ in response to changes in IC temperature so as to maintain a constant signal path delay.

In accordance with another aspect of the invention, a temperature sensitive silicon diode is included in the integrated circuit (IC). The compensation circuit supplies a constant current to the diode to produce a voltage $V_D(T)$ across the diode that varies linearly with the temperature T of the IC. The delay compensation circuit uses that diode voltage as an indication of IC temperature.

In accordance with a further aspect of the invention, a linear differential amplifier having an appropriately adjusted gain produces an output control voltage $V_x(T)$ proportional to the diode voltage $V_D$. The control voltage $V_x(T)$ and a stable source voltage $V_s$ are summed to produce an appropriate IC power supply voltage $V_{ss}(T)$ for each IC temperature such that the signal path delay through the IC remains substantially constant despite IC temperature changes.

The present invention is inexpensive and easy to implement because it requires only standard components; a diode, a current source and a differential amplifier, and only the diode need be formed on the IC itself.

The concluding portion of this specification particularly points out and distinctly claims the subject matter of the present invention. However those skilled in the art will best understand both the organization and method of operation of the invention, together with further advantages and objects thereof, by reading the remaining portions of the specification in view of the accompanying drawing(s) wherein like reference characters refer to like elements.

BRIEF DESCRIPTION OF THE DRAWING(S)

FIG. 1 illustrates in block diagram form an integrated circuit tester employing a delay compensation circuit in accordance with the present invention; and FIG. 2 illustrates the delay compensation circuit of FIG. 1 in more detailed block diagram form.

DESCRIPTION OF THE PREFERRED EMBODIMENT(S)

Figure 1:
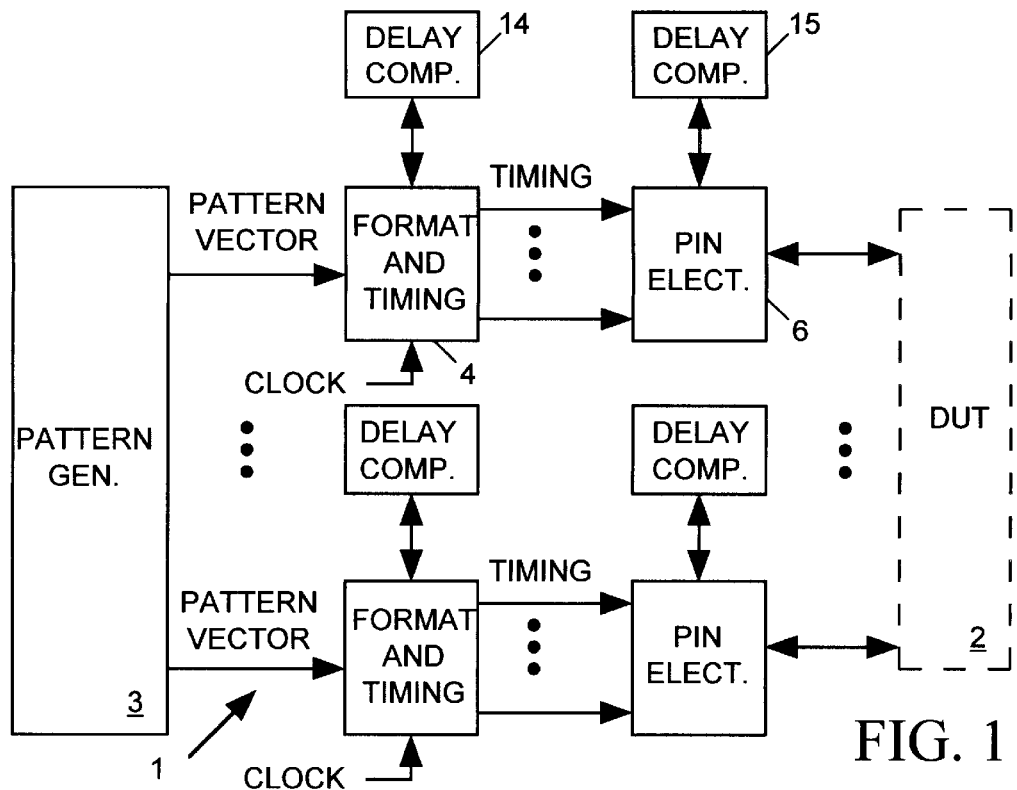

FIG. 1 illustrates an integrated circuit (IC) tester 1 in accordance with the present invention. Tester 1 performs a test on a circuit device under test (DUT) 2, the test being organized into a sequence of test cycles. Tester 1 includes a pattern generator 3 for generating a set of PATTERN VECTOR sequences, one sequence for each input/output terminal of DUT 2. Each sequence includes a separate PATTERN VECTOR for each test cycle. Each PATTERN VECTOR is a data word indicating actions the tester is to take at a DUT terminal during a corresponding test cycle and also indicating times during the test cycle that the tester is to take the actions. For example tester 1 may drive a DUT terminal high and/or low at particular times during the test cycle or may sample an output signal produced at the terminal by the DUT at some particular time or times during the test cycle.

Tester 1 includes a separate formatting and timing circuit 4 and a separate pin electronics circuit 6 for each DUT terminal. Each format and timing circuit 4 processes a PATTERN VECTOR sequence from pattern generator 3 and controls one or more TIMING signals in response thereto. Each TIMING signal controls a separate action of pin electronics circuit 6. Each PATTERN VECTOR tells format and timing circuit 4 which TIMING signals are to change state during a test cycle and when, relative to a particular pulse of an input reference CLOCK signal, the TIMING signals are to change state. The pin electronics circuit 6 carries out its test activities in response to the state changes in those TIMING signals.

The format and timing circuit 4 includes a programmable delay circuit for each TIMING signal. Upon receiving an input PATTERN VECTOR prior to the start of a test cycle, the format and timing circuit 4 programs those delay circuits to delay selected CLOCK signal pulses thereby to provide output TIMING signal edges at the appropriate times during the test cycle. For example if a PATTERN VECTOR indicates that a pin electronics 6 is to drive a test signal high one nanosecond after a particular CLOCK signal pulse, the format and timing circuit 4 programs an internal delay circuit to produce a TIMING signal edge pulse at an appropriate time after that particular CLOCK signal pulse such that when the pin electronics circuit 6 responds to the TIMING signal edge, it drives the test signal high exactly one nanosecond after the format and timing circuit 4 received the CLOCK signal pulse.

Thus to make a pin electronics circuit 6 assert a test signal one nanosecond after a CLOCK signal pulse, a PATTERN VECTOR tells format and timing circuit 4 to appropriately delay the CLOCK signal pulse to produce a TIMING signal edge. However the format and timing circuit 4 does not set the delay of its internal programmable delay circuit to one nanosecond. Instead it adjusts its programmable delay to somewhat less than one nanosecond to account for inherent delays of various components included in the signal path between the CLOCK signal pulse and the DUT terminal. These components are not necessarily included in the programmable delay circuit within format and timing circuit 4 and include, for example, drivers and logic stages in the pin electronics circuit 6 and in the format and timing circuit 4 itself.

Thus to ensure accurate timing of activities at the DUT terminal, the variable delay portion of the delay between CLOCK and TIMING signals provided by format and timing circuit 4 must be calibrated to account for the inherent delays of other components in the signal path. Once format and timing circuit 4 is calibrated, any change in the inherent delays of those other components would result in errors in timing of actions carried out at the DUT terminal. Since the inherent delay of transistor-based logic stages and drivers in the signal path is a function of IC temperature, one source of change in inherent signal path delay is temperature variation in the IC devices forming format and timing circuit 4 and pin electronics circuit 6. In accordance with the invention, to preserve timing accuracy despite changes in temperature of these IC devices, the inherent signal path delay between the CLOCK signal and DUT terminal is made substantially independent of IC temperature by providing a separate delay compensation circuit 14 for each format and timing circuit 4 and for each pin electronics circuit 6. Each delay compensation circuit 14 senses the temperature of its associated format and timing circuit 4 or pin electronics circuit 6 and adjusts the circuit's inherent path delay so that it remains constant despite changes in IC temperature.

Figure 2:
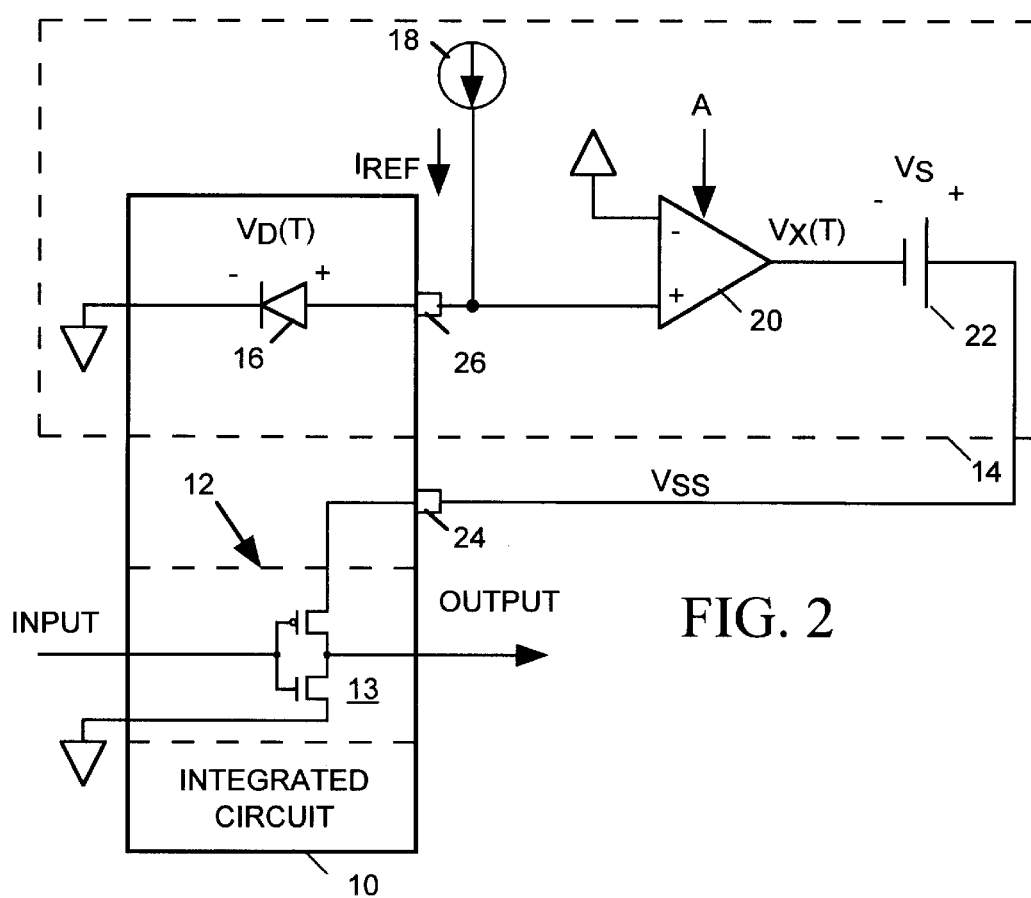

FIG. 2 represents either format and timing circuit 4 or pin electronics circuit 6 of FIG. 1 in simplified form as an integrated circuit (IC) 10 including a signal path 12 for producing an OUTPUT signal (e.g. a TIMING signal or a DUT test signal) in response to an INPUT signal (e.g. the CLOCK signal or a TIMING signal). For simplicity signal path 12 is represented as a simple CMOS inverter 13, but may actually include several transistor logic stages, drivers and other devices. Regardless of the logic circuitry forming it, signal path 12 produces an OUTPUT signal in delayed response to an INPUT signal, with an inherent signal path delay that is a function of the switching speed of the transistors forming signal path 12.

Over the relatively wide normal operating temperature range of CMOS transistors, transistor switching speed is a linear function of the temperature T of IC 10. As the IC temperature increases, the switching speed of the transistors that form it decreases, thereby increasing signal path delay. CMOS transistor switching speed is also a linear function of the power supply voltage $V_{ss}$ of IC 10 over the normal operating range of the transistor. As $V_{ss}$ increases, transistor switching speed increases, thereby increasing signal path delay.

FIG. 2 also illustrates delay compensation circuit 14 of FIG. 1 in more detailed block diagram form. Delay compensation circuit 14 senses the temperature of IC 10 and appropriately increases or decreases $V_{ss}$ in response to changes in the temperature of IC 10 so as to maintain a constant signal path delay despite the temperature variation. If the temperature of IC 10 increases, delay compensation circuit 14 increases the IC power supply voltage $V_{ss}$ so that the decrease in inherent signal path delay resulting from increased supply voltage compensates for the increase in signal path delay resulting from increased temperature. Similarly, when the IC temperature decreases, delay compensation circuit 14 decreases $V_{ss}$ to increase inherent signal path delay by the correct amount needed to compensate for the decrease in signal path delay due to decreased temperature.

Compensation circuit 14 employs a current source 18 and a silicon diode 16 (actually included within IC 10) to produce a voltage signal $V_T$ that is a linear function of IC temperature. Current source 18 sends a constant current $I_{REF}$ to ground through diode 16 thereby producing across diode 16 the voltage $V_D$ (T). The diode voltage $V_D$ drives a first (+) input of a linear, differential operational amplifier 20. The second (−) input of amplifier 20 is grounded. Amplifier 20 produces an output signal $V_x(T)$ having a magnitude proportional to $V_D(T)$, $$V_x(T)=A*V_D(T) \qquad [1]$$

where the constant A is the gain of amplifier 20. An adjustable power supply 22 having a DC output voltage $V_s$ is connected between the output of amplifier 20 and the power supply input terminal 24 of IC 10. In this arrangement, the IC power supply voltage $V_{ss}(T)$ is the sum of $V_x(T)$ and $V_s$:

$$V_{ss}(T)=V_x(T)+V_s \qquad [2]$$

Substituting equation [1] into equation [2] we have:

$$V_{ss}(T)=A*V_D(T)+V_s \qquad [3]$$

over a normal range of operating temperatures, the diode voltage $V_D(T)$ is a linear function of temperature T having the form $$V_D(T)=V_0+K1*T \qquad [4]$$

where K1 and $V_0$ are constants. Substituting equation [4] into equation [3] we have:

$$V_{ss}(T)=A*K1*T+A*V_o+V_s \qquad [5]$$

Since the terms $A*V_o$ and $V_s$ of equation [5] are constants, we can let a constant K2 equal the sum of $A*V_o$ and $V_s$ so that equation [5] reduces to $$V_{ss}(T)A*K1*T+K2. \qquad [6]$$

from equation [6] we can see that since A, K1 and K2 are constants which do not vary with temperature, then $V_{ss}(T)$ is a linear function of IC temperature T. The nature of that linear function (its slope and intercept) depends on the values of amplifier gain A and the constants K1 and K2. The constant K1 is a fixed characteristics of IC 10 but, since the constant A is the gain of amplifier 20 and since the constant K2 equals $A*V_o+V_s$, by adjusting the values of A and $V_s$, we can adjust the manner in which $V_{ss}(T)$ changes with temperature. In accordance with the present invention, amplifier gain A is selected so that when the temperature T of the IC 10 changes, any effect that temperature change has on the switching speed of the transistors forming signal path 12 is offset by an equal and opposite effect on transistor switching speed caused by a resulting change in $V_{ss}(T)$. Thus with amplifier gain A appropriately adjusted, as explained in detail below, the delay of signal path 12 will remain constant despite changes in IC temperature.

The delay $D_T$ of signal path 12 is defined as the delay between an edge of the INPUT signal and a resulting edge of the OUTPUT signal. Over the normal operating temperature range of IC 10, the delay $D_T$ of signal path 12 is a linear function both of temperature and $V_{ss}$ which can be expressed as $$D_T=K4*T-K3*V_{ss}(T) \qquad [7]$$

where K3 and K4 are process related constants that vary with the nature of IC 10 but do not vary with temperature. The K4*T term on the right side of equation [7] represents the contribution to signal path delay of IC temperature to signal path delay and the $-K3*V_{ss}(T)$ term represents the contribution of power supply voltage to signal path delay. Solving equation [7] for $V_{ss}(T)$, we have $$V_{ss}(T)=(K4/K3)T-D_T/K3 \qquad [8]$$

we want to find an appropriate value for the gain A of amplifier 20 that will render the signal path delay $D_T$ independent of temperature. To find the appropriate amplifier gain A we simply assume $D_T$ is a constant and then use of equations [8] and [6] to solve for A. Assuming, then, that the signal path delay $D_T$ is constant with respect to T, we can differentiate equations [6] and [8] with respect to T to obtain the following expressions:

$$d(V_{ss}(T))/dT=(K4/K3) \qquad [9]$$

$$d(V_{ss}(T)/dT=A*K1 \qquad [10]$$

Solving equations [9] and [10] for amplifier gain A, we have $$A=(K4/K3)/K1 \qquad [11]$$

For typical 0.5 micron CMOS integrated circuits the quantity (K4/K3)/K1 is about −3. Thus if we want to ensure that the delay time $D_T$ through signal path 12 is constant and independent of temperature for 0.5 micron CMOS IC's, we should set the gain A of amplifier 20 to about −3. However K1, K3 and K4, though temperature independent, are process variables that vary from IC to IC. Thus the appropriate amplifier gain A is also a process variable which should be separately determined for each type of integrated circuit. For high accuracy, the appropriate amplifier gain A should be calibrated for each individual IC. The amplifier gain can be easily calibrated by iteratively adjusting amplifier gain while measuring signal path delay at various IC temperatures until an amplifier gain is found for which signal path delay is substantially independent of IC temperature.

As may be seen in FIG. 2, IC 10 need only include a silicon diode 14 accessed through one additional terminal 26 to adapt IC 10 for delay compensation in accordance with the present invention. The remainder of compensation circuit 14 may be external to the IC. This makes it easy to upgrade existing IC designs for delay compensation. However since delay compensation circuit 14 is made up of relatively simple standard components, those skilled in the art will understand that it is possible to implement all of delay compensation circuit 14 (except source 22) on the integrated circuit 10 itself. Where a high degree of accuracy over delay control is not required, the gain A of amplifier 20 can be based on expected IC characteristics rather than determined through a calibration process. This allows us to avoid having to provide IC inputs for controlling the gain A of amplifier 20 when implemented on the IC being delay compensated.

While the foregoing specification has described preferred embodiment(s) of the present invention, one skilled in the art may make many modifications to the preferred embodiment without departing from the invention in its broader aspects. The appended claims therefore are intended to cover all such modifications as fall within the true scope and spirit of the invention.

What is claimed is:

1. A method for controlling a signal path delay in an integrated circuit wherein the signal path delay is influenced by a temperature of the integrated circuit and by a voltage of a power supply signal input to the integrated circuit, the method comprising the steps of:

sensing a threshold voltage of a diode incorporated into said integrated circuit, wherein said threshold voltage is indicative of said temperature of said integrated circuit and controlling said power supply signal voltage such that said power supply signal voltage is a function of the sensed threshold voltage.

2. The method in accordance with claim 1 wherein the step of controlling said power supply signal voltage comprises adjusting said sower supply signal voltage in response to changes in the sensed threshold voltage such that said signal path delay does not change substantially with said temperature of said integrated circuit.

3. The method in accordance with claim 1 wherein the step of controlling said power supply signal voltage comprises the steps of:

increasing said power supply signal voltage when the sensed threshold voltage increases, and decreasing the power supply signal voltage when the sensed threshold voltage decreases.

4. An apparatus for controlling a signal path delay in an integrated circuit wherein the signal path delay is influenced by a temperature of the integrated circuit and by a voltage of a power supply signal input to the integrated circuit, the apparatus comprising:

a diode incorporated into said integrated circuit, said diode having a threshold voltage that varies with the temperature of said integrated circuit, and controller means for sensing said threshold voltage and for adjusting the power supply signal voltage such that the power supply signal voltage is a function of said threshold voltage.

5. The apparatus in accordance with claim 4 wherein said controller means adjusts said power supply signal voltage in response to changes in said threshold voltage such that said signal path delay remains substantially invariant with respect to the temperature of said integrated circuit.

6. The apparatus in accordance with claim 5 wherein said controller means comprises means for supplying a current through said diode such that said threshold voltage develops across said diode.

7. The apparatus in accordance with claim 6 wherein said controller means further comprises:

means for amplifying said threshold voltage across said diode to produce a control voltage, and means receiving said control voltage for producing said power supply signal, wherein said power supply signal voltage is a function of said control voltage.

8. The apparatus in accordance with claim 4 wherein said power supply signal voltage is a linear function of said temperature of said integrated circuit.

9. An apparatus for transmitting a test signal to a circuit device under test, the apparatus comprising:

means for generating a timing signal;

an integrated circuit receiving a power supply signal and including a signal path for receiving said timing signal and for generating said test signal in response to said timing signal following a signal path delay that is a function of a temperature of said integrated circuit and of a voltage of said power supply signal;

a diode incorporated into said integrated circuit, said diode having a threshold voltage that varies with the temperature of said integrated circuit, and controller means for sensing said threshold voltage and for adjusting said power supply signal voltage such that the power supply signal voltage is a function of said threshold voltage.

10. The apparatus in accordance with claim 9 wherein said controller means comprises:

means for supplying a current through said diode such that said threshold voltage develops across said diode.

11. The apparatus in accordance with claim 10 further comprises:

means for amplifying said threshold voltage across said diode to produce a control voltage; and means receiving said control voltage for producing said power supply signal, wherein a voltage of said power supply signal is a function of said control voltage.

12. The apparatus in accordance with claim 11 wherein said voltage of said power supply signal is a linear function of said temperature of said integrated circuit.

* * * * *